(12) United States Patent
Jamal

(10) Patent No.: US 7,635,999 B1
(45) Date of Patent: *Dec. 22, 2009

(54) CLOCK FREQUENCY DIVISION METHODS AND CIRCUITS

(75) Inventor: Shafiq M Jamal, Gilroy, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 12/178,357

(22) Filed: Jul. 23, 2008

Related U.S. Application Data

(63) Continuation of application No. 11/317,537, filed on Dec. 23, 2005, now Pat. No. 7,417,474.

(51) Int. Cl.
*H03B 19/00* (2006.01)
(52) U.S. Cl. .................... 327/117; 377/47; 377/48
(58) Field of Classification Search ............. 327/117, 327/113–115, 141, 155, 363, 291, 299; 377/47, 377/48
See application file for complete search history.

(56) References Cited

U.S. PATENT DOCUMENTS

| 6,157,694 A | * | 12/2000 | Larsson | 377/48 |
| 6,895,070 B2 | * | 5/2005 | Kobayashi et al. | 377/47 |
| 7,342,430 B1 | * | 3/2008 | Chiang | 327/295 |

* cited by examiner

*Primary Examiner*—Lincoln Donovan
*Assistant Examiner*—Diana J Cheng

(57) ABSTRACT

Frequency division methods and circuits are provided for producing an output clock signal with a frequency related to the frequency of an input clock signal by a predetermined factor. The method and circuit rely on the input clock signal and on feedback from the output signal to produce an intermediate signal. The frequency of the intermediate signal is divided to produce the output clock signal. The method and circuit may be implemented using few circuit components. In an exemplary embodiment, the method and circuit may be used to produce an output clock signal with a frequency that is two-and-a-half times lower than the frequency of the input clock signal.

19 Claims, 11 Drawing Sheets

CLOCK FREQUENCY DIVISION METHODS AND CIRCUITS

CROSS REFERENCE TO RELATED APPLICATIONS

This is a continuation of copending, commonly-assigned U.S. patent application Ser. No. 11/317,537, filed Dec. 23, 2005, which is hereby incorporated herein by reference in its entirety.

BACKGROUND OF THE INVENTION

This invention relates to methods and circuits for providing an output clock signal with a frequency related to the frequency of an input clock signal.

Circuits may require clock signals with different frequencies for their operation. While multiple clock generation circuits may be used to produce clocks of different frequencies, the clock signals produced by the different clock circuits are generally not synchronized. In addition, the clock generation circuits require added circuitry, and occupy additional on-chip area. In integrated circuit implementations, the multitude of independent clock signals may require numerous input/output circuits to transmit the clock signals to other circuits or devices external to the integrated circuit.

Clock division circuits may be used to generate clock signals of different frequencies from a single input clock signal. The clock division circuits may require less circuitry and on-chip area than multiple clock generation circuits. In integrated circuits, the use of clock division circuitry requires only a single clock to be generated and/or received by the circuit. The integrated circuit may therefore require less input/output circuitry, as only a single clock need be received or transmitted. In addition, as the clock signals produced by clock division circuits are all dependent on the same input clock, the frequencies of the output clock signals are precisely synchronized.

Clock division circuits that produce clock signals with frequencies related to each other by particular integer ratios are well known. Clock division circuits that produce clock signals in non-integer ratios may rely on phase-locked loops (PLL) for their operation. Such clock division circuits may require large amounts of circuitry for their operation.

Improved clock division methods and circuits operative to produce output clock signals related by non-integer frequency ratios and requiring small amounts of circuitry are needed.

SUMMARY OF THE INVENTION

The invention provides methods and systems for producing an output clock signal with a frequency that is related to the frequency of an input clock signal by a fixed factor.

The system, which in a preferred embodiment may be implemented as a circuit, includes a switch operative to transmit to its output either the input clock signal or the complement of the input clock signal depending on the state of a switch control signal. A frequency division circuit produces the output clock signal from the signal at the output of the switch. A feedback path from the output of the circuit back to the switch produces the switch control signal based on the output clock signal.

The method includes producing a feedback signal with a frequency related to the frequency of the output clock signal by a fixed factor. The method further includes producing an intermediate signal, the intermediate signal transitioning between states when the input clock signal transitions between states and when the feedback signal transitions between states. The output clock signal is produced by reducing the frequency of transitions in the intermediate signal by an integer factor.

BRIEF DESCRIPTION OF THE DRAWINGS

Further features of the invention, its nature and various advantages, will be more apparent from the accompanying drawings and the following detailed description.

DETAILED DESCRIPTION OF THE INVENTION

Figure 1:
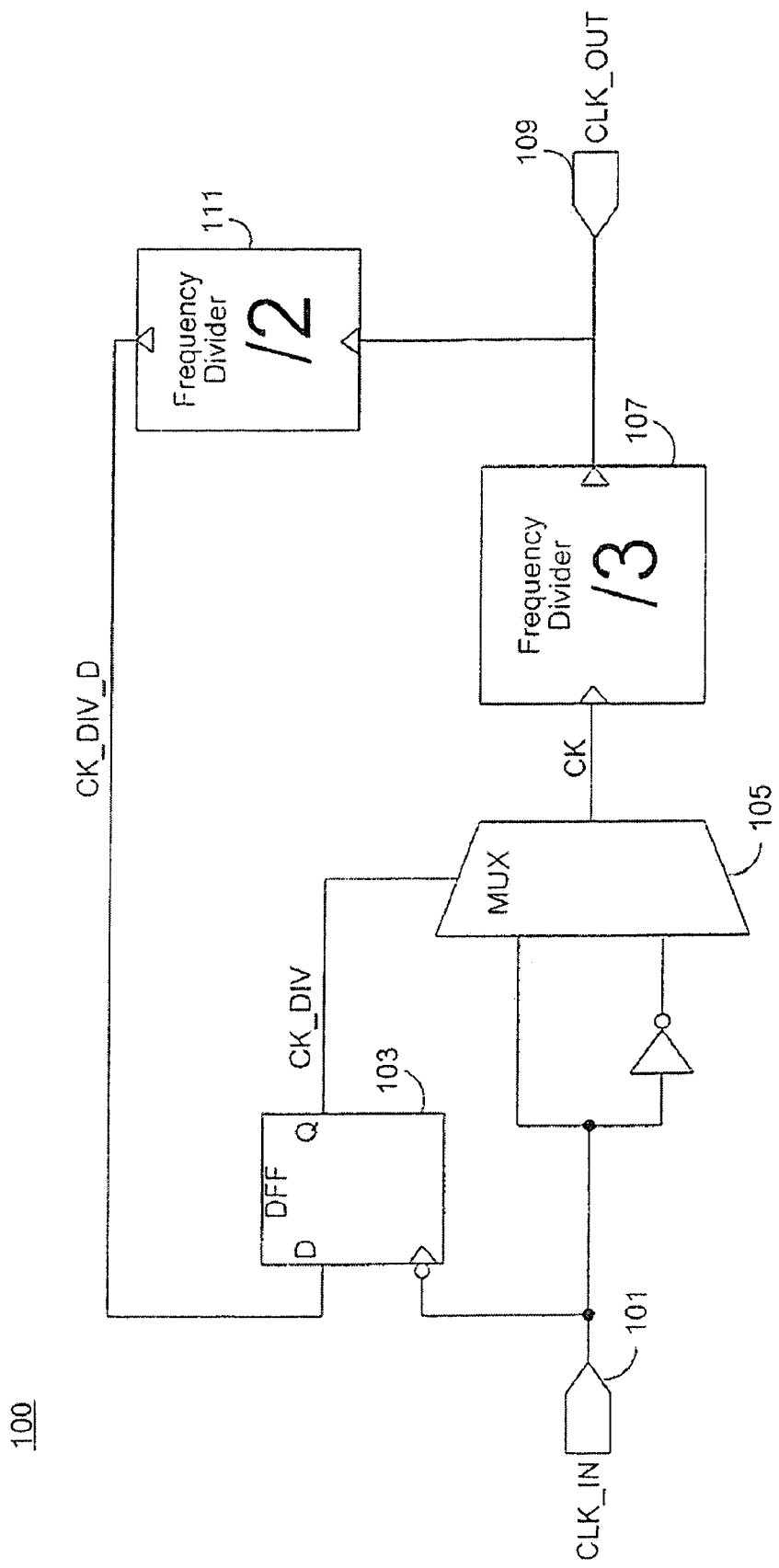
FIG. 1 is a schematic diagram of a frequency division circuit in accordance with the principles of the invention.

FIG. 1 is a schematic diagram of a frequency division circuit 100 in accordance with the principles of the invention. In the particular embodiment shown in FIG. 1, circuit 100 is operative to produce an output signal CLK_OUT with a frequency F_OUT that is two-and-a-half (2.5) times lower than the frequency F_IN of the input signal CLK_IN. For purposes of a non limiting illustration, circuit 100 may receive an input clock signal CLK_IN with a frequency of 320 MHz, and may produce an output clock signal CLK_OUT with a frequency of 128 MHz. Circuit 100 may also function properly with input and output clock signals of higher or lower frequencies.

Circuit 100 relies on feedback from the output clock signal CLK_OUT to maintain a constant frequency ratio F_IN/F_OUT between the input signal frequency and the output signal frequency. During normal circuit operation, the output signal frequency tracks the input signal frequency to ensure that small variations or more significant changes in the input signal frequency will be reflected in the output signal frequency.

In the particular circuit embodiment shown in FIG. 1, circuit 100 receives at its input node 101 the input clock signal CLK_IN with frequency F_IN, and produces at its output node 103 an output clock signal CLK_OUT with frequency F_OUT=F_IN/2.5. It should be noted that while the particular embodiment of circuit 100 is operative to produce signals with a frequency ratio of two-and-a-half (2.5), circuits with different frequency ratios may be produced in accordance with the principles of the invention.

In order to maintain a precise frequency ratio, circuit 100 uses both the input signal CLK_IN and a fed-back component CK_DIV_D of the output signal to produce the output signal CLK_OUT with the required frequency. The output signal CLK_OUT is fed-back through frequency divider circuit 111 to the input of flip-flop 103. Frequency divider 111 produces the signal CK_DIV_D that has a frequency F_D that is half of the output signal frequency, and one fifth of the input signal frequency: $F\_D = F\_OUT/2 = F\_IN/5$. Because signal CK_DIV_D is produced by a divide-by-two frequency divider circuit 111, CK_DIV_D generally has a 50% duty-cycle. The CK_DIV_D is therefore HIGH for exactly half of its period, and LOW for the remaining half period. It should be noted that because of various transmission delays caused by the components of circuit 100, the feedback signal CK_DIV_D may have a different phase than the input signal CLK_IN.

Figure 2:
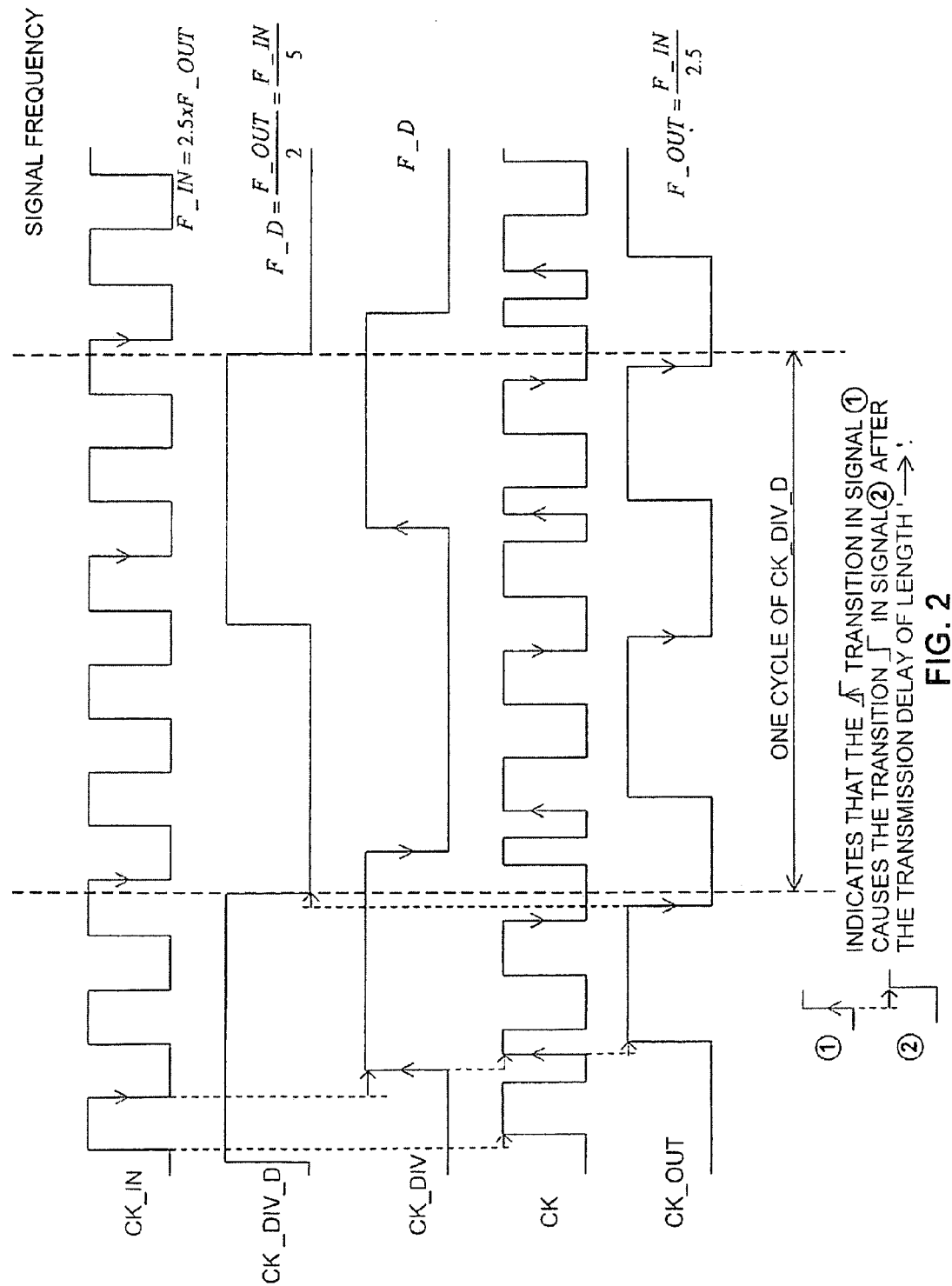
FIG. 2 is a timing diagram of the frequency division circuit shown in FIG. 1.

FIG. 2 shows a timing diagram illustrating the operation of the frequency division circuit 100 of FIG. 1. The upper-most traces in FIG. 2 represent an input clock signal CLK_IN with an input frequency F_IN, and a feedback signal CK_DIV_D signal with frequency $F\_D = F\_IN/5$. The phase between the two signals is arbitrary, and may be influenced by the transmission delays of the various components of circuit 100.

The input clock signal CLK_IN and feedback signal CK_DIV_D control the operation of flip-flop 103. Flip-flop 103 is used to synchronize the CLK_IN and CK_DIV_D signals, by producing an output signal CK_DIV that has the same frequency F_D as the feedback signal and whose transitions are synchronized with the transitions of the input clock signal. Flip-flop 103 receives signal CK_DIV_D at its input, and receives the input clock signal CLK_IN at its inverted clock input. The flip-flop produces the output signal CK_DIV whose state transitions are synchronized with falling edges of the input clock signal.

FIG. 2 shows the synchronized feedback signal CK_DIV. Signal CK_DIV has the same frequency, $F\_D = F\_IN/5$, as signal CK_DIV_D. The transitions of signal CK_DIV are synchronized with falling edges of the input clock signal. In general, while the transitions of the two signals are synchronized, timing delays caused by flip-flop 103 may cause the transitions in CK_DIV to occur shortly after those of CLK_IN. Those falling transitions in the input clock signal causing transitions in CK_DIV are marked by downward pointing arrows in the timing diagram of FIG. 2. A dashed line and a horizontal arrow below the first of the falling edges in the CLK_IN signal illustratively shows the transmission delay between the CLK_IN and CK_DIV signals. Unlike signal CK_DIV_D, signal CK_DIV may have a duty-cycle other than 50%. In the exemplary timing diagram of FIG. 2, for example, signal CK_DIV has a duty-cycle above 50%. Flip-flop 103 is operative to synchronize the input clock signal CLK_IN and the feedback signal CK_DIV_D. While the resynchronization of the signals may increase the reliability of clock division circuit 100, it is not essential to the proper functioning of the clock division circuit. In embodiments that do not include flip-flop 103, the feedback signal CK_DIV_D line may be coupled to the CK_DIV signal line.

The synchronized feedback signal CK_DIV is used to control the operation of multiplexer 105. Multiplexer 105 is a two-input multiplexer which receives at one input the input clock signal CLK_IN, and at the other input the complement CLK_INB of the input clock signal. Signals CLK_IN and CLK_INB are complementary, and are in opposite states at all times. Multiplexer 105 produces an output signal CK that is equal to the input clock signal CLK_IN when the CK_DIV signal is LOW, and that is equal to the complementary input clock signal CLK_INB when CK_DIV is HIGH.

The timing diagram of FIG. 2 shows an exemplary CK signal produced by the CLK_IN and CK_DIV signals described previously. When the CK_DIV signal is LOW, the multiplexer output signal CK transitions between states each time the CLK_IN signal transitions. When the CK_DIV signal is HIGH, the multiplexer output signal CK transitions between states each time the CLK_INB signal transitions. Because signal CK is equal to either the CLK_IN or the CLK_INB signal at all times, signal CK transitions between states each time the input clock signal transitions between states. During any one period of the CK_DIV signal, because the CK_DIV signal has a frequency that is five times that of the input signal, the CK signal will go through ten (10) state transitions corresponding to transitions in the CLK_IN signal.

In addition, because the signal at the two inputs of multiplexer 105 are always complementary, the multiplexer output signal CK will transition between states each time the multiplexer control signal CK_DIV changes state. During any one period of the CK_DIV signal, the CK signal will therefore go through an additional two (2) state transitions corresponding to transitions in the CK_DIV signal. The multiplexer output signal CK will therefore transition between states a total of 10+2=12 (twelve) times during any one period of the CK_DIV signal. FIG. 2 shows an exemplary multiplexer output signal CK.

The multiplexer output signal CK is coupled to the input of a divide-by-three frequency division circuit 107. Divide-by-three frequency division circuit 107 is operative to reduce the frequency of the signal CK at its input by a factor of three. Circuit 107 may produce an output signal CLK_OUT that transitions between states following every third transition in its input signal CK. During any one period of the CK_DIV signal, the clock signal CLK_OUT at the output of circuit 107 transitions 12/3=4 (four) times. Because the output clock signal CLK_OUT transitions four times during one cycle of the CK_DIV signal, the output signal CLK_OUT has a frequency F_OUT that is twice the frequency F_D of the synchronized CK_DIV and non-synchronized CK_DIV_D feedback signals.

FIG. 2 shows an exemplary output clock signal CLK_OUT. In the timing diagram of FIG. 2, the CLK_OUT signal transitions between states following every third transition in the CK signal. Those state transitions in the CK signal causing a transition in the CLK_OUT signal are indicated by directional arrows. In turn, every other transition in the CLK_OUT signal causes a state transition in the CK_DIV_D signal. Those state transitions in the CLK_OUT signal causing a state transition in the CK_DIV_D signal are indicated by directional arrows.

Both the feedback divide-by-two frequency division circuit 111 and the feed-forward circuitry of circuit 100 are operative to maintain a ratio of two between the output clock frequency F_OUT and the feedback signal frequency F_D. In addition, as described above, the circuitry 100 of FIG. 1 is operative to maintain a ratio of two-and-a-half between the input clock frequency F_IN and the output clock frequency F_OUT. The feedback and feed-forward loops of circuit 100 track the input clock signal frequency, and ensure that the output frequency remains precisely two-and-a-half times lower than the input frequency at all times.

Figure 3A:
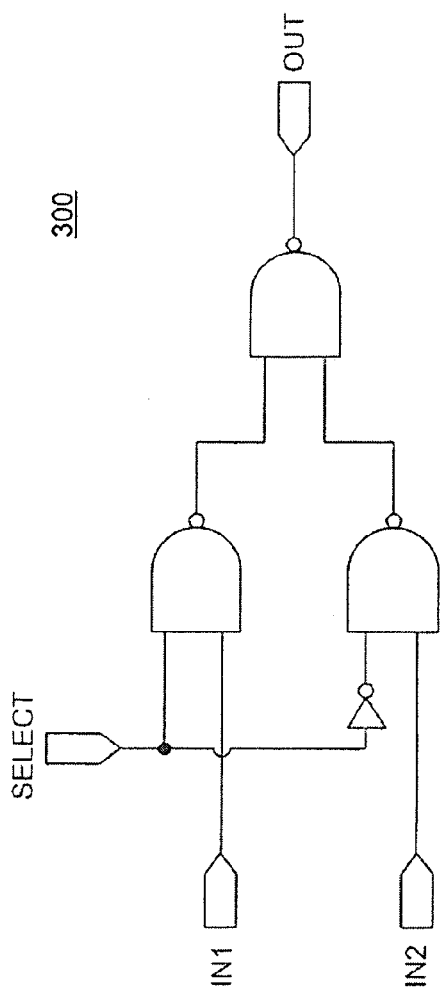
FIG. 3A shows a multiplexer.
Figure 3B:
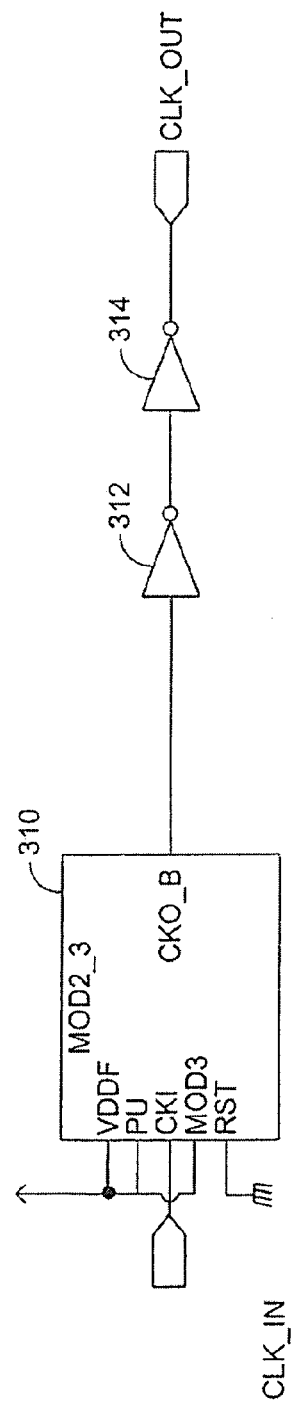
FIG. 3B shows a divide-by-three frequency division circuit.
Figure 3C:
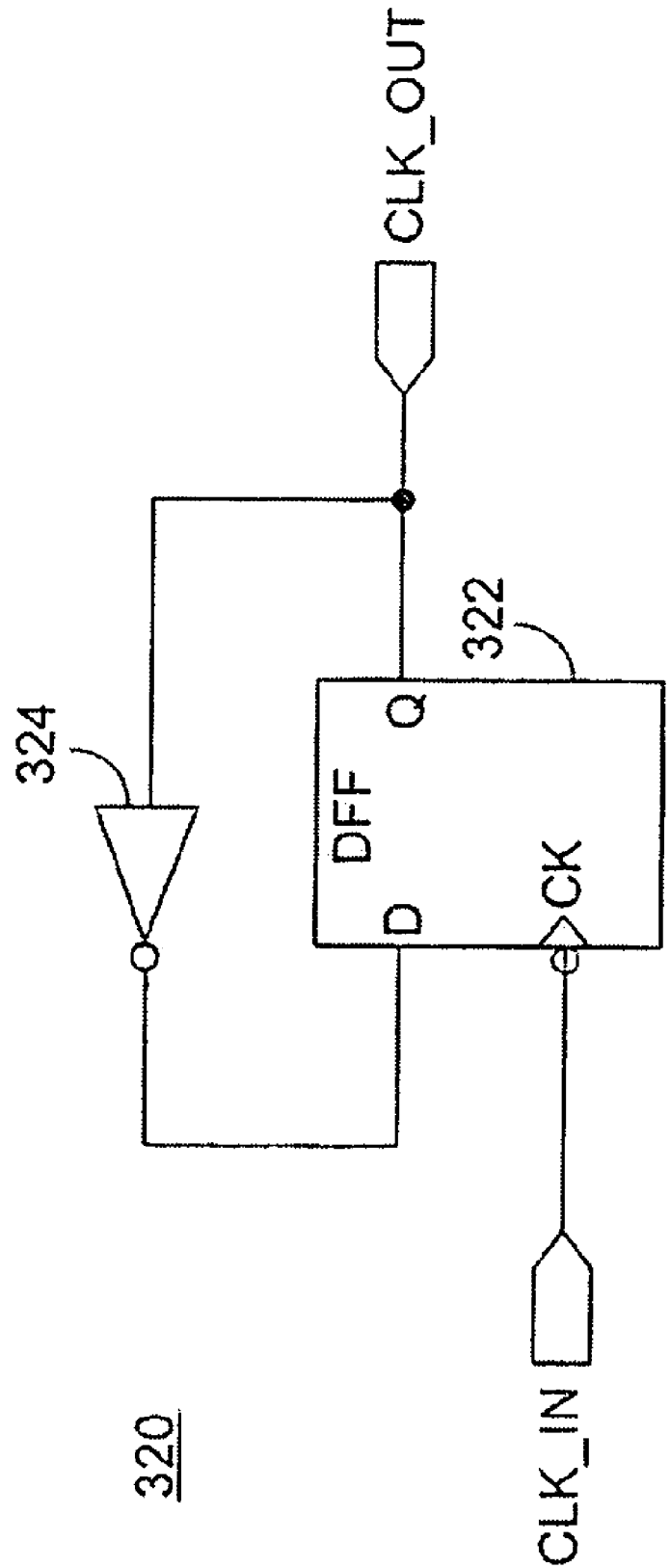
FIG. 3C shows a divide-by-two frequency division circuit.

FIGS. 3A-3C show circuit components that may be used to produce a circuit embodiment of circuit 100. The circuit components of FIGS. 3A-3C may be used in implementations of circuit 100 made in integrated circuitry or other types of circuitry.

FIG. 3A shows an embodiment of a multiplexer 300 formed using three NAND gates. Multiplexer 300 may be used as multiplexer 105, for example.

FIG. 3B shows an embodiment of a divide-by-three frequency division circuit 310 that may be used as circuit component 107 of FIG. 1. Circuit 310 is a standard modulo-two-or-three circuit that produces an output signal CKO_B that has a frequency of one-half or one-third that of the input clock signal CLK_IN. A HIGH voltage signal may be applied to the MOD3 input of circuit 310 to place the circuit in the divide-by-three mode of operation. Output buffers 312 and 314 may be coupled to the output of circuit 310 to provide additional driving strength at the output node CLK_OUT of the circuit.

FIG. 3C shows a divide-by-two frequency division circuit 320 that may be used as circuit component 111 of FIG. 1. Circuit 320 may include a flip-flop 322 receiving the input clock signal CLK_IN at its inverted clock input CK. Circuit 320 may also include inverter 324 coupled between the output of the flip-flop and the input of the flip-flop. Inverter 324 ensures that the state of flip-flop 322 will change on every falling transition of the input clock signal, thereby ensuring that the frequency of the output signal CLK_OUT is half of the input signal CLK_IN frequency.

Referring now to FIGS. 4A-4G, various exemplary implementations of the present invention are shown.

Figure 4A:
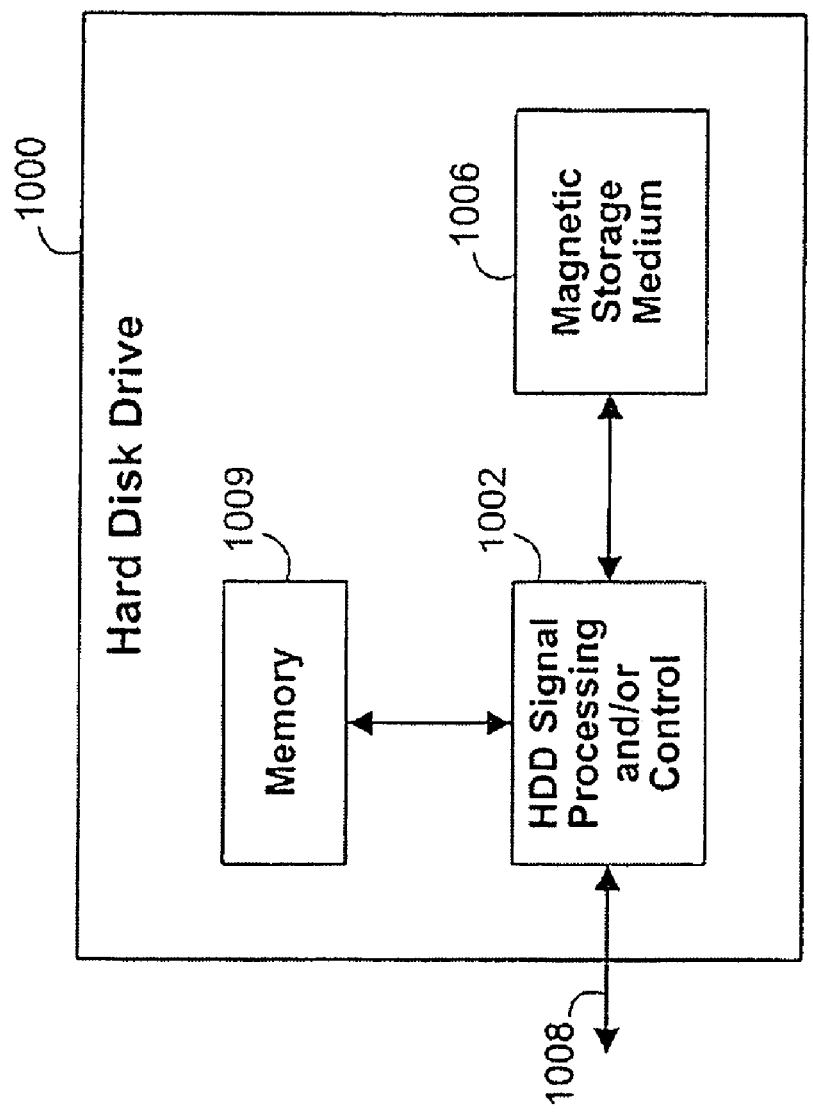
FIG. 4A is a block diagram of an exemplary hard disk drive that can employ the disclosed technology.

Referring to FIG. 4A, the present invention can be implemented in a hard disk drive 1000. The present invention may be implemented in either or both signal processing and/or control circuits, which are generally identified in FIG. 4A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 4B:
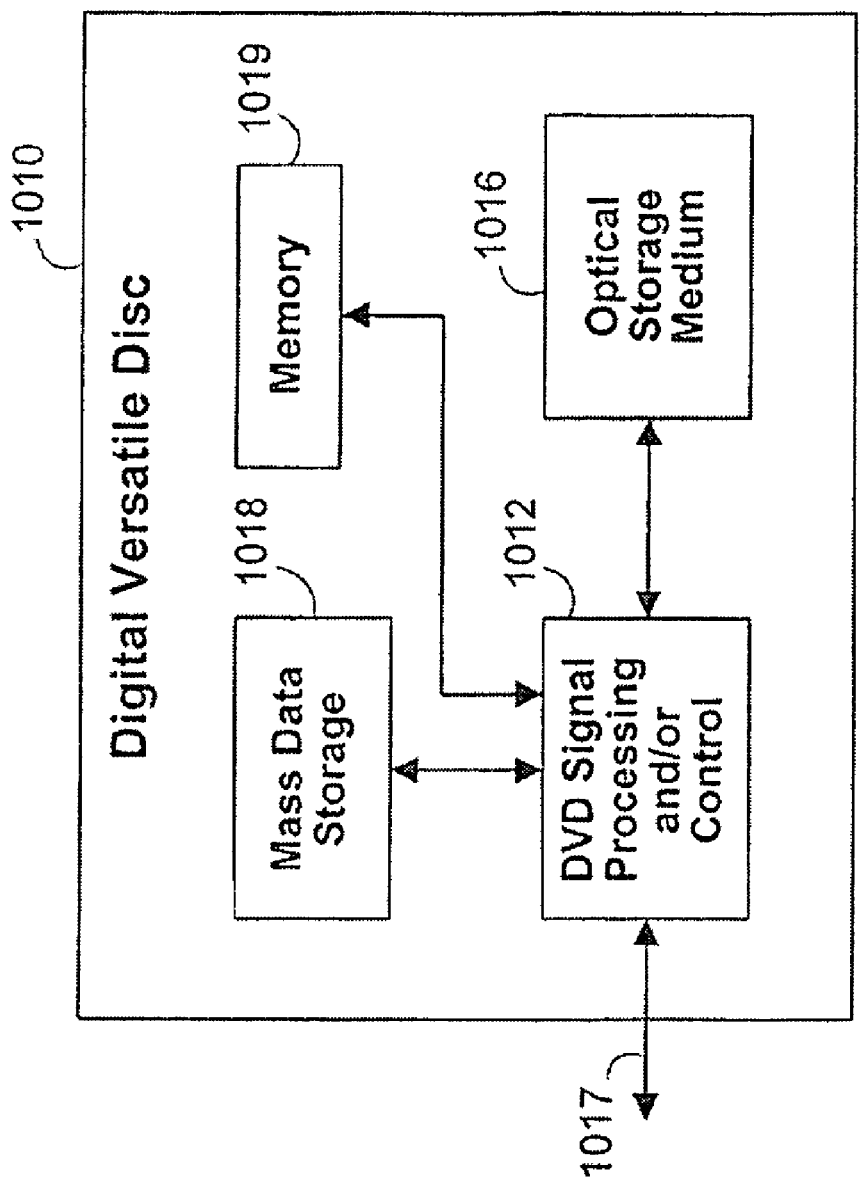
FIG. 4B is a block diagram of an exemplary digital versatile disc that can employ the disclosed technology.

Referring now to FIG. 4B, the present invention can be implemented in a digital versatile disc (DVD) drive 1010. The present invention may implement either or both signal processing and/or control circuits, which are generally identified in FIG. 4B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 4A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 4C:
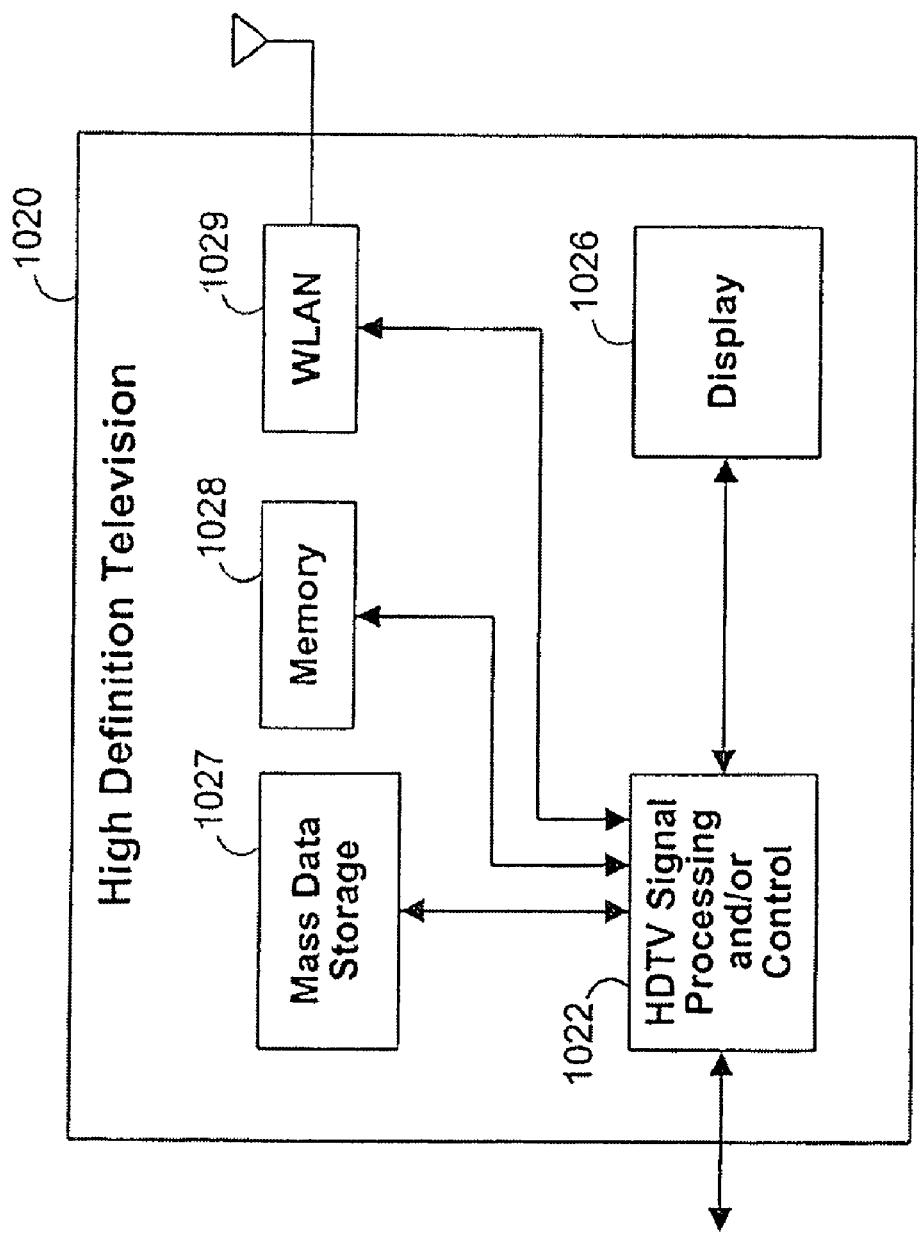
FIG. 4C is a block diagram of an exemplary high definition television that can employ the disclosed technology.

Referring now to FIG. 4C, the present invention can be implemented in a high definition television (HDTV) 1020. The present invention may implement either or both signal processing and/or control circuits, which are generally identified in FIG. 4C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 4A and/or at least one DVD may have the configuration shown in FIG. 4B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 4D:
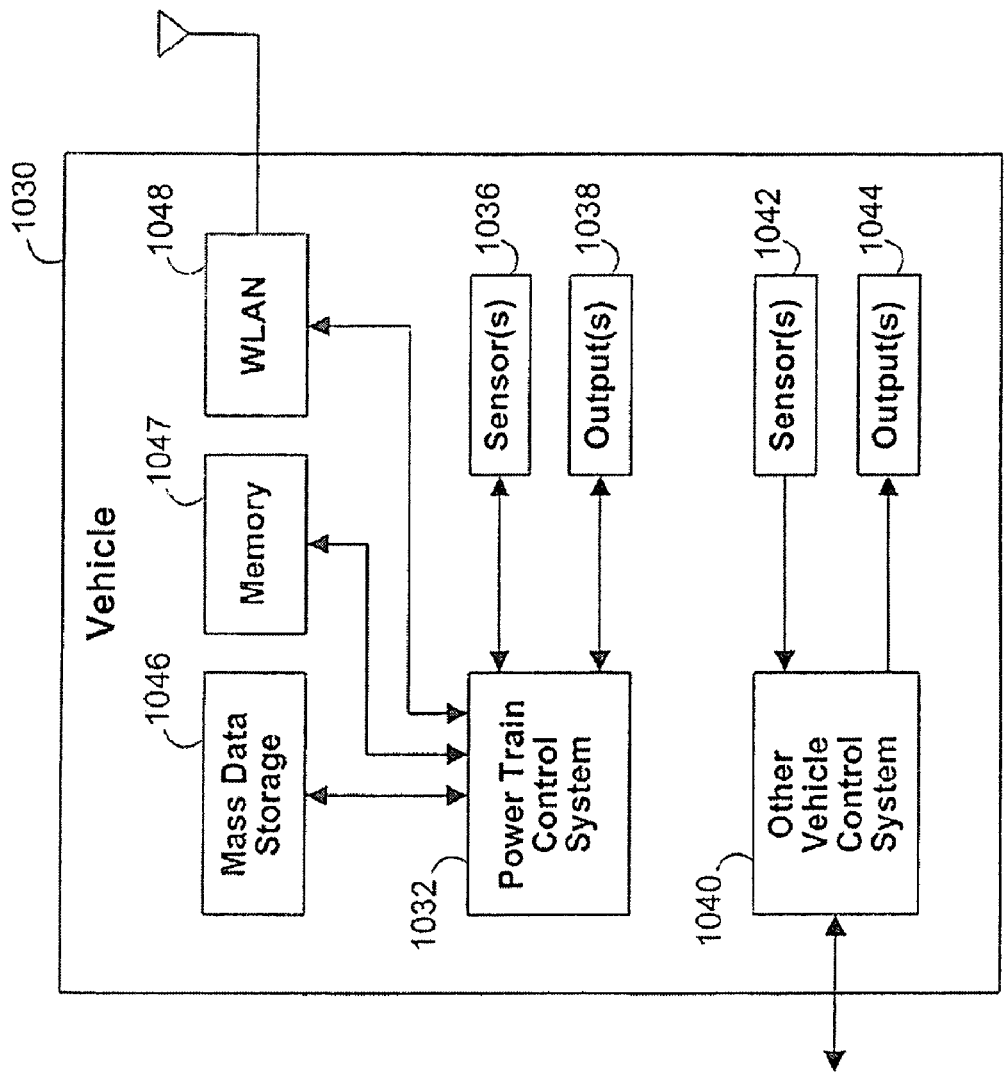
FIG. 4D is a block diagram of an exemplary vehicle that can employ the disclosed technology.

Referring now to FIG. 4D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 4E:
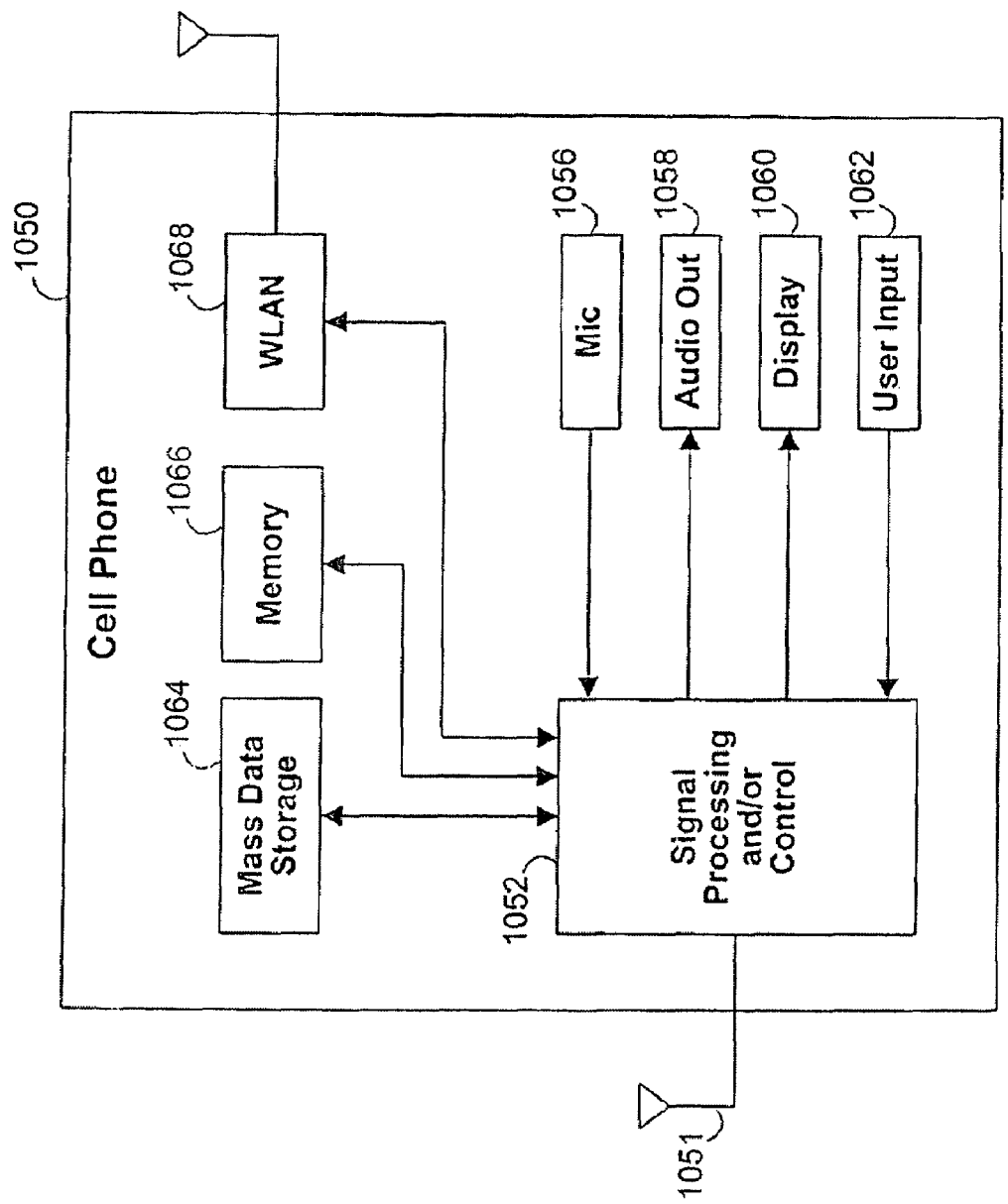
FIG. 4E is a block diagram of an exemplary cell phone that can employ the disclosed technology.

Referring now to FIG. 4E, the present invention can be implemented in a cellular phone 1050 that may include a cellular antenna 1051. The present invention may implement either or both signal processing and/or control circuits, which are generally identified in FIG. 4E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 4F:
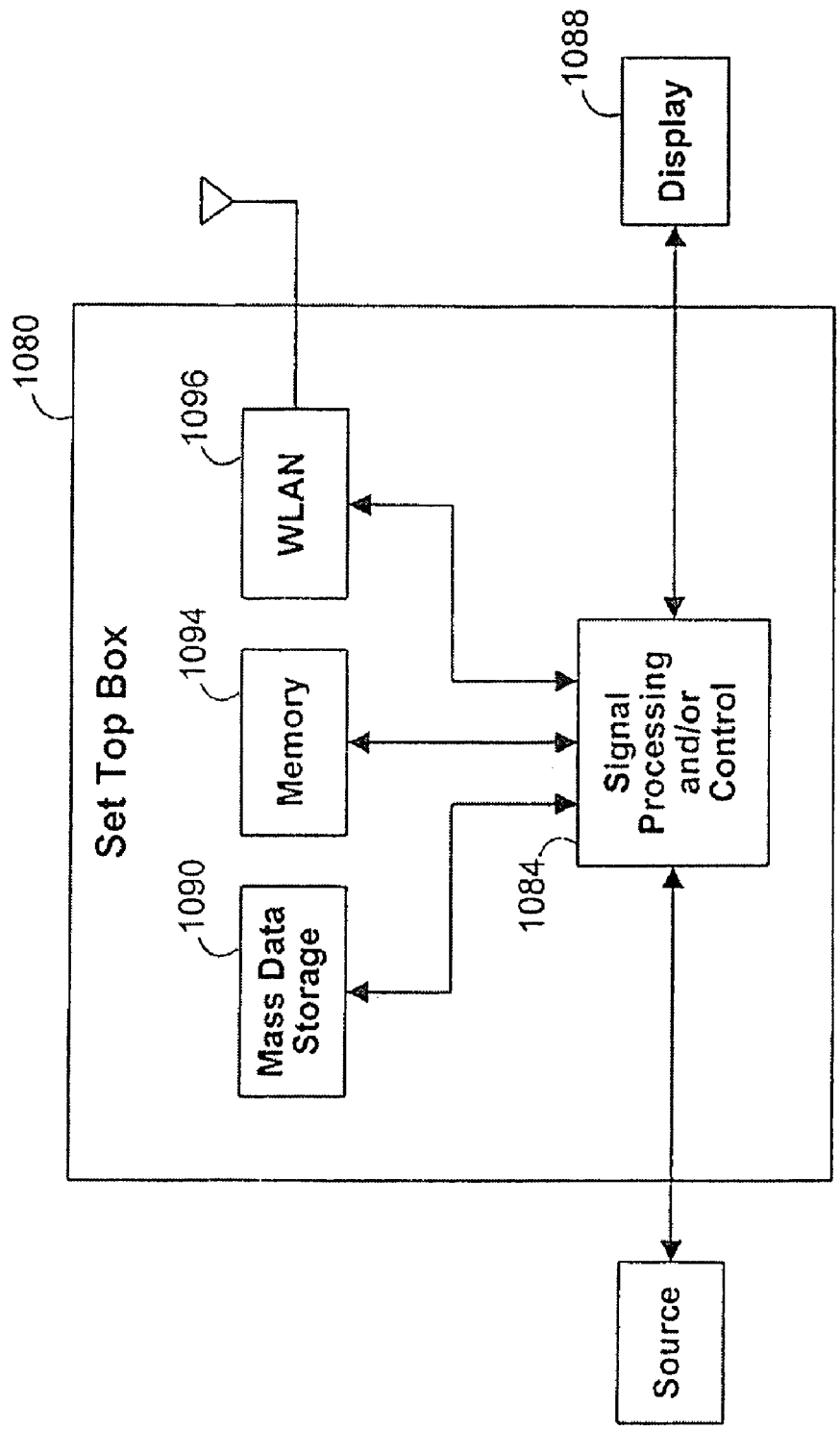
FIG. 4F is a block diagram of an exemplary set top box that can employ the disclosed technology.

Referring now to FIG. 4F, the present invention can be implemented in a set top box 1080. The present invention may implement either or both signal processing and/or control circuits, which are generally identified in FIG. 4F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 4G:
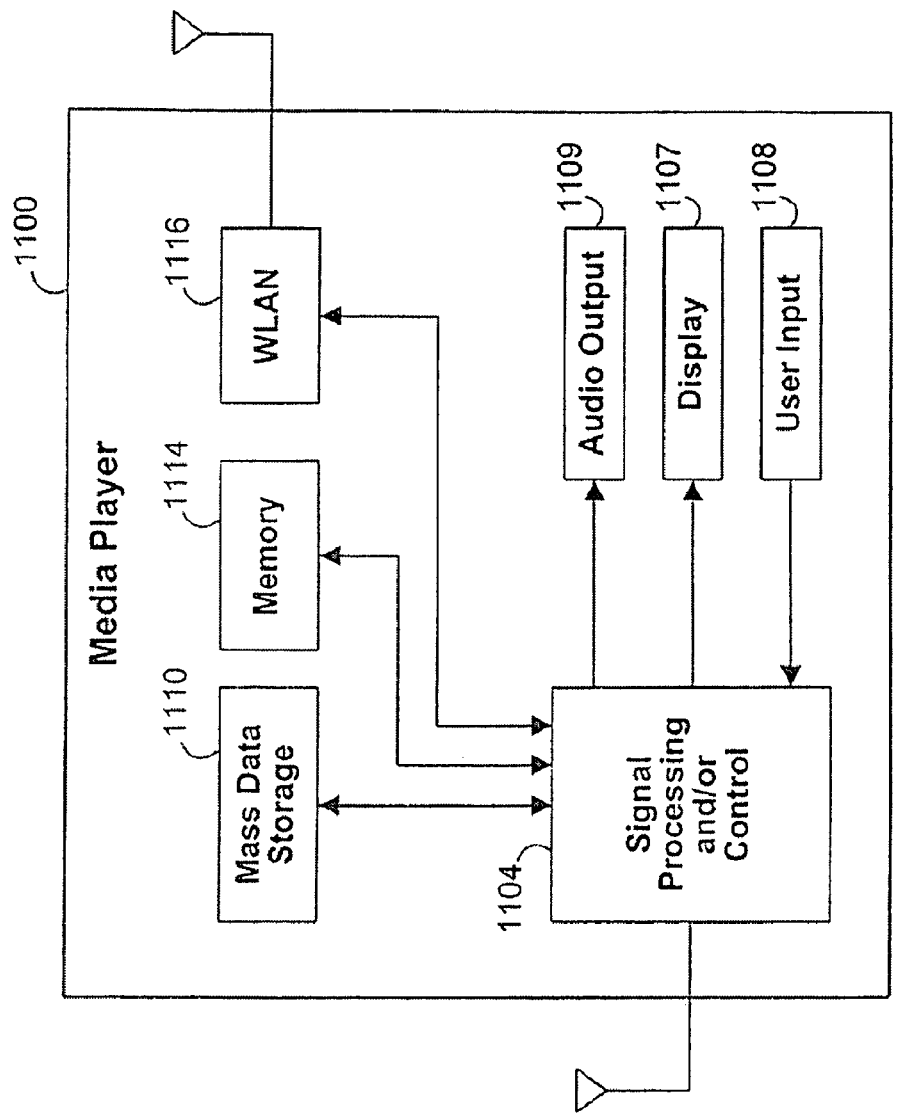
FIG. 4G is a block diagram of an exemplary media player that can employ the disclosed technology.

Referring now to FIG. 4G, the present invention can be implemented in a media player 1100. The present invention may implement either or both signal processing and/or control circuits, which are generally identified in FIG. 4G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

It will be understood that the foregoing is only illustrative of the principles of the invention, and that various modifications can be made by those skilled in the art without departing from the scope and spirit of the invention. The particular methods and circuit implementations shown herein are presented for purposes of illustration and not of limitation, and other constructions and embodiments can be used instead if desired.

The invention claimed is:

1. A system for producing an output signal with a frequency related to a frequency of an input signal by a fixed factor, the system comprising:
 a switch operative to selectively transmit to its output one of the input signal and a complement of the input signal in response to a switch control signal;
 a first frequency division circuit operative to produce the output signal from the signal at the output of the switch; and
 a feedback path operative to produce the switch control signal based on the output signal, wherein the feedback path comprises:
  a second frequency division circuit operative to produce a feedback signal such that the ratio of the output signal frequency to a frequency of the feedback signal is an integer; and
  a memory operative to receive the feedback signal at its first input, to receive the input signal at its second input, and to produce the switch control signal at its output.

2. The system of claim 1, wherein the feedback path is operative to produce the switch control signal such that a ratio of the output signal frequency to a frequency of the switch control signal is an integer.

3. The system of claim 1, wherein the switch is a multiplexer.

4. The system of claim 1, wherein the first frequency division circuit is operative to produce the output signal such that the output signal transitions between states once for every three transitions in the signal at the output of the switch.

5. The system of claim 2, wherein the ratio of the output signal frequency to the switch control signal frequency is equal to two.

6. The system of claim 1, wherein a ratio of the input signal frequency to the output signal frequency is non-integer.

7. The system of claim 6, wherein the ratio of the input signal frequency to the output signal frequency is equal to two-and-a-half (2.5).

8. A system for producing an output signal with a frequency related to a frequency of an input signal by a fixed factor, the system comprising:
    means for selectively transmitting to an intermediate node one of the input signal and a complement of the input signal in response to a switch control signal;
    means for producing the output signal from the signal at the intermediate node by reducing a frequency of the signal at the intermediate node; and
    means for producing the switch control signal based on the output signal, wherein the means for producing the switch control signal comprises:
    means for producing a feedback signal such that a ratio of the output signal frequency to a frequency of the feedback signal is an integer; and
    means for synchronizing the feedback signal with the input signal, with the means for synchronizing receiving the feedback signal at its first input, receiving the input signal at its second input, and producing the switch control signal at its output.

9. The system of claim 8, wherein the means for producing the switch control signal produces the switch control signal such that a ratio of the output signal frequency to a frequency of the switch control signal is an integer.

10. The system of claim 8, wherein the means for selectively transmitting is a multiplexer.

11. The system of claim 8, wherein the means for producing the output signal produces the output signal such that the output signal transitions between states once for every three transitions in the signal at the intermediate node.

12. The system of claim 9, wherein the ratio of the output signal frequency to the switch control signal frequency is equal to two.

13. The system of claim 8, wherein a ratio of the input signal frequency to the output signal frequency is non-integer.

14. The system of claim 13, wherein the ratio of the input signal frequency to the output signal frequency is equal to two-and-a-half (2.5).

15. A method for producing an output signal with a frequency related to a frequency of an input signal by a fixed factor, the method comprising:
    producing a feedback signal with a frequency related to the frequency of the output signal by a second fixed factor, wherein the feedback signal is synchronized with the input signal;
    producing an intermediate signal, the intermediate signal transitioning between states when the input signal transitions between states and when the feedback signal transitions between states; and
    producing the output signal by reducing a frequency of transitions in the intermediate signal by an integer factor.

16. The method of claim 15, wherein the frequency of the feedback signal is one-half the frequency of the output signal.

17. The method of claim 15, wherein the output signal transitions between states once for every three transitions in the intermediate signal.

18. The method of claim 15, wherein a ratio of the input signal frequency to the output signal frequency is non-integer.

19. The method of claim 18, wherein the ratio is equal to two-and-a-half (2.5).

* * * * *